(12) United States Patent
Fukuzaki et al.

(10) Patent No.: US 7,432,165 B2
(45) Date of Patent: Oct. 7, 2008

(54) SEMICONDUCTOR MEMORY DEVICE, SEMICONDUCTOR DEVICE, AND METHOD FOR PRODUCTION THEREOF

(75) Inventors: Yuzo Fukuzaki, Kanagawa (JP); Hiroshi Takahashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 64 days.

(21) Appl. No.: 11/464,711

(22) Filed: Aug. 15, 2006

(65) Prior Publication Data
US 2006/0275982 A1 Dec. 7, 2006

Related U.S. Application Data

(62) Division of application No. 11/024,901, filed on Dec. 29, 2004, now Pat. No. 7,126,177.

(30) Foreign Application Priority Data

Jan. 16, 2004 (JP) .............................. P2004-009319

(51) Int. Cl.
*H01L 21/336* (2006.01)
(52) U.S. Cl. ........................ 438/286; 438/301; 438/303; 438/286; 257/E21.651
(58) Field of Classification Search .................. 438/437, 438/52, 286, 303, 265; 257/E21.613, E21.66, 257/906, 297, 304, E27.09, E21.562, E21.649, 257/E21.653, E21.396, E21.651
See application file for complete search history.

(56) References Cited

U.S. PATENT DOCUMENTS

| | | | | |
|---|---|---|---|---|
| 6,168,958 | B1 * | 1/2001 | Gardner et al. | 438/3 |
| 6,291,847 | B1 * | 9/2001 | Ohyu et al. | 257/306 |
| 6,462,369 | B1 * | 10/2002 | Matsufusa | 257/296 |
| 7,151,028 | B1 * | 12/2006 | Fang et al. | 438/257 |

\* cited by examiner

*Primary Examiner*—Ha Nguyen
*Assistant Examiner*—Chakila Tillie
(74) *Attorney, Agent, or Firm*—Sonnenschein Nath & Rosenthal LLP

(57) ABSTRACT

Disclosed are a semiconductor memory device, a semiconductor device, and a method for production thereof. The semiconductor memory device and semiconductor device do not need for a distance for alignment of lithography to make the contact hole with lithography to form the gate electrode. Hence the resulting devices have a reduced area for the cell array. The semiconductor memory device is composed of a substrate having trenches formed side by side, a plate electrode which is formed to a prescribed depth from the surface of the inner wall of the trench, a capacitor insulating film which covers the surface of the inner wall of the trench, a memory node electrode MN which fills the trench, with the capacitor insulating film interposed between them, and a memory node contact plug which is buried in a contact hole which is so made as to reach the memory node electrode from the surface of the semiconductor layer. A metallized region is integrally formed to connect at least part of the surface of the semiconductor layer and at least part of the surface of the contact plug to each other.

5 Claims, 15 Drawing Sheets

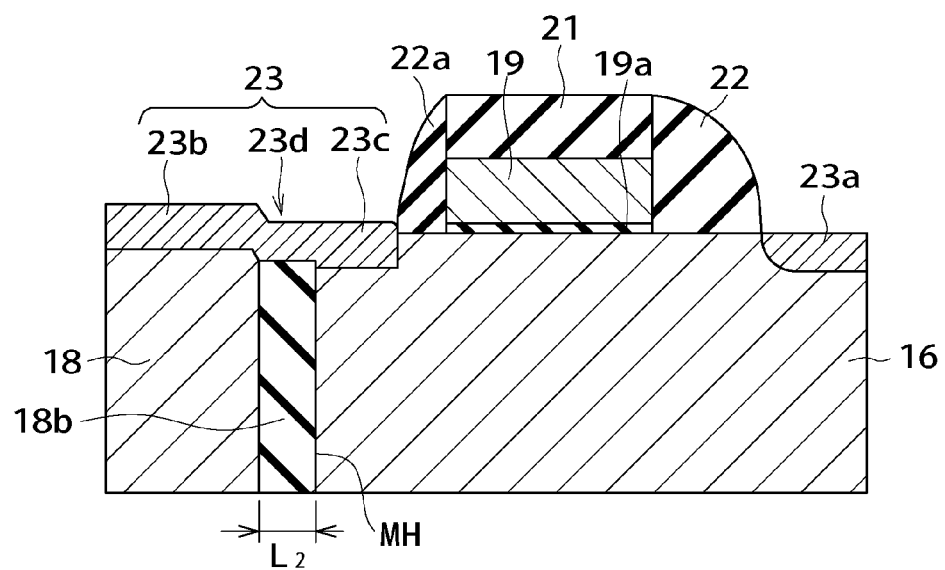
F I G. 1 3

F I G. 1 5 A  PRIOR ART
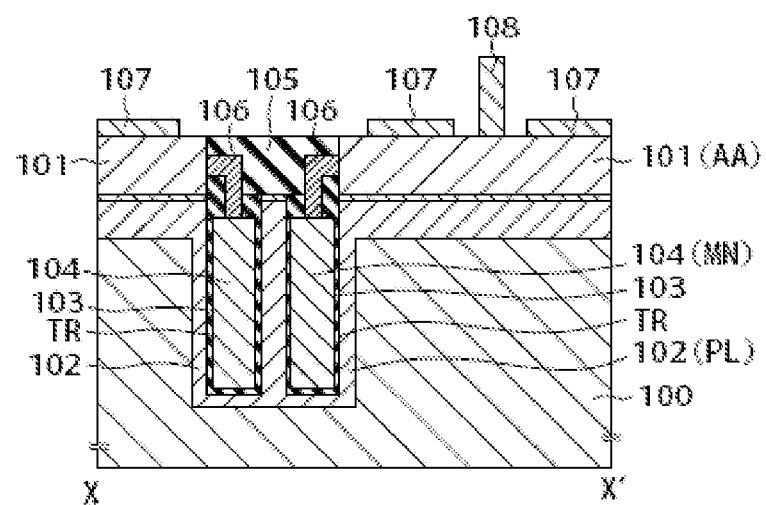
F I G. 1 5 B  PRIOR ART
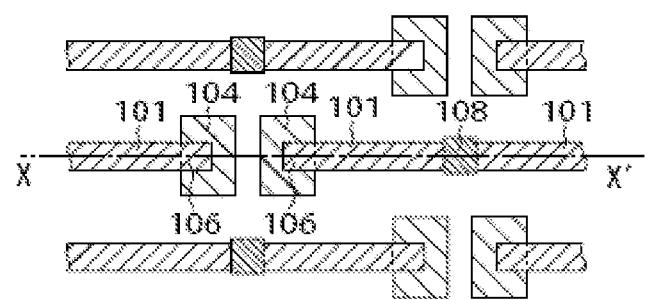

SEMICONDUCTOR MEMORY DEVICE, SEMICONDUCTOR DEVICE, AND METHOD FOR PRODUCTION THEREOF

RELATED APPLICATION DATA

This application is a divisional of U.S. patent application Ser. No. 11/024,901, filed Dec. 29, 2004, now U.S. Pat. No. 7,126,177 which is incorporated herein by reference to the extent permitted by law. This application claims the benefit of priority to Japanese Patent Application No. JP 2004-009319 filed in the Japanese Patent Office on Jan. 16, 2004, which is incorporated herein to the extent permitted by law.

BACKGROUND OF THE INVENTION

The present invention relates to a semiconductor memory device, a semiconductor device, and a method for production thereof. More particularly, the present invention relates to a semiconductor memory device, a semiconductor device, and a method for production thereof, the semiconductor having a memory node contact or other contacts for DRAM (dynamic random access memory).

The recent advance in semiconductor devices (such as VLSI) is remarkable. In the last three years, they have decreased in size by 70 percent and increased in the degree of integration in proportion to size reduction. They have achieved higher performance than before.

The ever-increasing degree of integration is exemplified by the MOS-type DRAM in which one memory cell is composed of one switching transistor (metal oxide semiconductor field effect transistor [MOSFET]) and one memory capacitor. This DRAM functions as the process driver in semiconductor devices.

The miniaturization of devices decreases the area of the memory cell and reduces the area of the memory capacitor accordingly.

Despite reduction in its area, the memory capacitor remained unchanged in its storage capacity at 20 to 30 fF per bit over the past generations of DRAM, because a certain amount of storage capacity is necessary to ensure operational margin and effectively protect stored data from soft error due to α-rays.

In other words, the storage capacitor has to retain a certain amount of storage capacity even though its area decreases in proportion to miniaturization. This object has been achieved by several contrivances.

They include making the capacitor insulating film thicker and forming the capacitor insulating film from a material with a high dielectric constant, thereby increasing storage capacity.

On the other hand, contrivances have also been made in the structure of capacitor electrode. The memory capacitor, which consists of a memory node electrode (connected to a transistor), a plate electrode (connected to earth), and a capacitor insulating film interposed between them, may be formed in stack type or trench type. In the former case, the components are stacked one over another. In the latter case, the memory node electrode extends in the depthwise direction of the semiconductor substrate. Both structures increase the opposing surface areas of the memory node electrode and the plate electrode, thereby increasing the storage capacity of the capacitor.

A description is given below of the above-mentioned DRAM with trench-type capacitors.

FIG. 15A is a sectional view of a memory cell of a DRAM according to the first conventional embodiment. FIG. 15B is a plan view of the memory cell. The sectional view in FIG. 15A is taken along the line X-X' in FIG. 15B.

There is shown a p-type semiconductor substrate 100. A trench TR is formed in the region excluding a first n-type semiconductor layer 101 which becomes the active region AA. A second n-type semiconductor layer 102 is formed in a prescribed depth from the inner wall of the trench TR. It functions as the plate electrode PL or the memory capacitor.

A capacitor insulating film 103 is formed which covers the inner wall of the trench TR. Its inside is filled with a third n-type semiconductor layer 104 of polysilicon, which functions as the memory node electrode MN of the memory capacitor.

As mentioned above, the memory capacitor is composed of a second n-type semiconductor layer 102 (plate electrode PL), a capacitor insulating film 103, and a third n-type semiconductor layer 104 (memory node electrode MN).

The first n-type semiconductor layer 101 (active region AA) is separated by an element isolation insulating film 105 of STI (Shallow Trench Isolation) type of silicon oxide, in which is buried a fourth semiconductor layer 106 of polysilicon.

In the first n-type semiconductor layer 101 (active region AA) are a channel forming region and a source-drain region (not shown) holding it. On the first n-type semiconductor layer 101 (active region AA) in the channel forming region is a gate electrode 107 which is formed with a gate insulating film (not shown) interposed thereunder.

The MOSFET constructed as mentioned above has one source-drain electrically connected to the third n-type semiconductor layer 104 (the memory node electrode MN of the memory capacitor) through the semiconductor layer 106 and another source-drain connected to a bit line (not shown) through the bit contact 108. It also has the gate electrode 107 connected to a word line. A large number of memory cells each constructed as mentioned above are put together into a matrix pattern to form a DRAM.

In the above-mentioned structure, the connection of the fourth semiconductor layer 106 to the source-drain region in the first n-type semiconductor layer 101 is accomplished by impurity diffusion from the fourth semiconductor layer 106 to the first n-type semiconductor layer 101.

This connecting method has restrictions on the trench area as follows.

(1) Connecting the fourth semiconductor layer 106 to the first n-type semiconductor layer 101 by impurity diffusion requires a certain distance between the end of the trench and the end of the gate electrode, which implies that the fourth semiconductor layer 106 should be sufficiently far away from the channel forming region in the first n-type semiconductor layer 101 so that the MOSFET fully exhibits its characteristic properties.

(2) A certain distance has to be secured from the active region AA of the adjoining cell for another bit.

Unfortunately, any attempt to remove the above-mentioned restrictions on the trench-type capacitor meets more difficulties in securing the sufficient trench diameter as miniaturization proceeds.

Consequently, it has become common practice to design the trench to be deeper than 5 μm in order to secure the surface area of the opposing planes of the memory node electrode and the plate electrode and to secure the storage capacity of the memory capacitor.

On the other hand, Patent Document 1 discloses a DRAM which has a trench-type capacitor (consisting of a memory node electrode, a capacitor insulating film, and a plate electrode) buried in the substrate and planarized and bonded to another silicon substrate through an insulating layer.

A description is given below of the above-mentioned DRAM with trench-type capacitors buried in the substrate.

FIG. 16A is a sectional view of a memory cell of a DRAM according to the second conventional embodiment. FIG. 16B is a plan view of the memory cell. The sectional view in FIG. 16A is taken along the line X-X' in FIG. 16B.

There is shown a semiconductor substrate 10. There is also shown a trench TR which is partitioned by a trench wall 10a and a mask layer 11. The mask layer 11 is the layer which was used as a mask when the trench TR was formed.

There is shown a first n-type semiconductor layer 12 extending to a certain depth from the surface of the inner wall of the trench TR. It functions as the plate electrode PL of the memory capacitor.

There is shown a capacitor insulating film 13 which covers the surface of the inner wall of the trench TR. A second n-type semiconductor layer 14 of polysilicon is buried inside the capacitor insulating film 13. It functions as the memory node electrode MN of the memory capacitor.

As mentioned above, the memory capacitor is composed of a first n-type semiconductor layer 12 (plate electrode PL), a capacitor insulating film 13, and a second n-type semiconductor layer 14 (memory node electrode MN).

The above-mentioned memory capacitor is covered sequentially with an interlayer insulating film 15 of silicon oxide and a third n-type semiconductor layer 16 of crystalline silicon (which functions as the active region AA).

The third n-type semiconductor layer 16 (active region AA) is separated by an element isolation insulating film 105 of STI type of silicon oxide.

There is shown a fourth semiconductor layer 18 of polysilicon. It is buried in the contact hole which is formed in the boundary region between the element isolation insulating film 17 and the third n-type semiconductor layer 16 such that it reaches the second n-type semiconductor layer 14 (memory node electrode MN).

In the third n-type semiconductor layer 16 (active region AA) are a channel forming region and a source-drain region (not shown) holding it. On the third n-type semiconductor layer 16 (active region AA) in the channel forming region is a gate electrode 19 which is formed with a gate insulating film (not shown) interposed thereunder.

The MOSFET constructed as mentioned above has one source-drain electrically connected to the second n-type semiconductor layer 14 (the memory node electrode MN) through the fourth semiconductor layer 18 and another source-drain connected to a bit line (not shown) through the bit contact 20. It also has the gate electrode 19 connected to a word line.

A large number of memory cells each constructed as mentioned above are put together into a matrix pattern to form a DRAM.

The DRAM having memory cells as mentioned above is constructed such that the MOSFET and the memory capacitor are placed on top of the other, with the interlayer insulating film 15 interposed between them. This structure permits the area of the memory capacitor to be maximized without limitations by the active region AA. Thus there is no need for the trench to be deeper than necessary. In addition, the trench can be made to have a large opening, which facilitates the lithography process and greatly reduces the etching time.

The DRAM having the above-mentioned memory cells is produced by the following process.

First, the semiconductor substrate 10 has the trench TR formed therein which becomes the capacitor later. The trench TR has the first n-type semiconductor layer 12 (plate electrode PL) and the capacitor insulating film 13 formed sequentially on its internal wall surface. The trench TR is filled with polysilicon deposited therein. Subsequently, the polysilicon undergoes etch-back.

Silicon oxide is deposited to form the interlayer insulating film 15, which is subsequently covered with the third n-type semiconductor layer 16, in which is formed the element isolation insulating film 17 by STI method.

A contact hole reaching the second n-type semiconductor layer 14 (memory node electrode MN) is made, and then it is filled with polysilicon to form the fourth semiconductor layer 18, which connects the second n-type semiconductor layer 14 to the source-drain region of the transistor to be formed in the third n-type semiconductor layer 16.

On the third n-type semiconductor layer 16 are formed the gate electrode 19, the source-drain region, and the bit contact 20.

According to the process mentioned above, the fourth semiconductor layer 18 (memory node contact plug) to connect the second n-type semiconductor layer 14 (memory node electrode MN) to the source-drain region should be formed from polysilicon containing a conductive impurity before the gate electrode is formed. This impurity is diffused from the fourth semiconductor layer 18 into the third n-type semiconductor layer 16 by heat treatment to be performed later. The thus diffused impurity serves for connection to the region which becomes the source-drain region later.

In this case, the gate electrode should be a certain distance away from the end of the diffused layer, and this necessitates to provide a certain distance for alignment of lithography to make the contact hole opening with lithography to form the gate electrode.

[Patent Document 1]
Japanese Patent Laid-open No. Hei 6-104398

SUMMARY OF THE INVENTION

The present invention was completed to address a problem with DRAM of conventional structure. The problem is that a certain distance is necessary for alignment of lithography to make the contact hole (for memory node contact) with lithography to form the gate electrode. This makes it difficult to reduce the cell array area.

The present invention is directed to a semiconductor memory device composed of a plurality of memory cells arranged therein, each memory cell consisting of a memory capacitor with a memory node electrode and a transistor, which includes a substrate having a plurality of trenches which are formed side by side and separated from each other by trench walls, a plate electrode which is formed to a prescribed depth from the surface of the inner wall of the trench, a capacitor insulating film which covers the surface of the inner wall of the trench, a memory node electrode which fills the trench, with the capacitor insulating film interposed between them, an interlayer insulating film which entirely covers the substrate and the memory node electrode, a semiconductor layer which is formed on the interlayer insulating film and which has the transistor formed therein, a memory node contact plug which is buried in a contact hole which is so made as to reach the memory node electrode from the surface of the semiconductor layer, and a metallized region which is formed integrally with at least part of the surface of the semiconductor layer and at least part of the surface of the memory node contact plug in such a way that the semiconductor layer is electrically connected to the memory node contact plug.

According to the present invention, the semiconductor memory device mentioned above is composed of a substrate having a plurality of trenches which are formed side by side and separated from each other by trench walls, a plate electrode which is formed to a prescribed depth from the surface of the inner wall of the trench, a capacitor insulating film which covers the surface of the inner wall of the trench, a memory node electrode which fills the trench, with the capacitor insulating film interposed between them, an interlayer insulating film which entirely covers the substrate and the memory node electrode, a semiconductor layer which is formed on the interlayer insulating film and which has the transistor formed therein, and a memory node contact plug which is buried in a contact hole which is so made as to reach the memory node electrode from the surface of the semiconductor layer.

A metallized region is formed integrally with at least part of the surface of the semiconductor layer and at least part of the surface of the memory node contact plug in such a way that the semiconductor layer is connected to the memory node contact plug by the metallized region.

The present invention is directed also to a semiconductor device which includes a substrate having a substructure, an interlayer insulating film which entirely covers the substructure, a semiconductor layer covering the interlayer insulating film, a contact plug filling a contact hole which is so made as to reach from the surface of the semiconductor layer to the substructure, and a metallized region which is integral with at least part of the surface of the semiconductor layer and at least part of the surface of the contact plug such that it electrically connects the semiconductor layer to the contact plug.

According to the present invention, the semiconductor device mentioned above is composed of a substrate having a substructure, an interlayer insulating film which entirely covers the substructure, a semiconductor layer covering the interlayer insulating film, and a contact plug filling a contact hole which is so made as to reach from the surface of the semiconductor layer to the substructure.

A metallized region is formed integrally with at least part of the surface of the semiconductor layer and at least part of the surface of the contact plug such that it electrically connects the semiconductor layer to the contact plug.

The present invention is directed to a method for production of a semiconductor memory device composed of a plurality of memory cells arranged therein, each memory cell consisting of a memory capacitor with a memory node electrode and a transistor, the method including a step of forming a plurality of trenches for memory capacitor side by side in a substrate, a step of forming a plate electrode reaching a prescribed depth from the surface of the inner wall of the trench, a step of forming a capacitor insulating film covering the surface of the inner wall of the trench, a step of filling the trench, thereby forming a memory node electrode, with the capacitor insulating film interposed, a step of forming an interlayer insulating film over the entire surface of the substrate and the memory node electrode, a step of forming a semiconductor layer on the interlayer insulating film, a step of making a contact hole reaching the memory node electrode from the surface of the semiconductor layer, a step of filling the contact hole with a conductive material, thereby forming a memory node contact plug, and a step of forming a metallized region integrally with at least part of the surface of the semiconductor layer and at least part of the surface of the memory node contact plug such that it electrically connects the semiconductor layer to the memory node contact plug.

According to the present invention, the above-mentioned method for production of a semiconductor memory device includes the steps of forming a plurality of trenches for memory capacitor side by side in a substrate, forming a plate electrode reaching a prescribed depth from the surface of the inner wall of the trench, forming a capacitor insulating film covering the surface of the inner wall of the trench, filling the trench, thereby forming a memory node electrode, with the capacitor insulating film interposed, forming an interlayer insulating film over the entire surface of the substrate and the memory node electrode, forming a semiconductor layer on the interlayer insulating film, making a contact hole reaching the memory node electrode from the surface of the semiconductor layer, filling the contact hole with a conductive material, thereby forming a memory node contact plug, and forming a metallized region integrally with at least part of the surface of the semiconductor layer and at least part of the surface of the memory node contact plug such that it electrically connects the semiconductor layer to the memory node contact plug.

The present invention is directed also to a method for production of a semiconductor device which includes a step of forming a substructure in a substrate, a step of covering entirely the substructure with an interlayer insulating film, a step of forming a semiconductor layer on the interlayer insulating film, a step of making a contact hole reaching the substructure from the surface of the semiconductor layer, a step of filling the contact hole with a conductive material, thereby forming a contact plug, and a step of forming a metallized region integrally with at least part of the surface of the semiconductor layer and at least part of the surface of the contact plug such that it electrically connects the semiconductor layer to the contact plug.

According to the present invention, the above-mentioned method for production of a semiconductor device includes the steps of forming a substructure in a substrate, covering entirely the substructure with an interlayer insulating film, forming a semiconductor layer thereon, making a contact hole reaching the substructure from the surface of the semiconductor layer, filling the contact hole with a conductive material, thereby forming a contact plug, and forming a metallized region integrally with at least part of the surface of the semiconductor layer and at least part of the surface of the contact plug such that it electrically connects the semiconductor layer to the contact plug.

The semiconductor memory device according to the present invention is characterized in that the memory node contact plug and the semiconductor layer are connected to each other through a metallized region in place of impurity diffused from the memory node contact plug. This structure eliminates heat treatment for impurity diffusion from the memory node contact plug, and hence no distance is necessary for alignment of lithography to make the contact hole with lithography to form the gate electrode. This leads to a cell array with a reduced area.

The semiconductor device according to the present invention is characterized in that the contact plug and the semiconductor layer are connected to each other through a metallized region in place of impurity diffused from the contact plug. This structure eliminates heat treatment for impurity diffusion from the contact plug, and hence no distance is necessary for alignment for impurity diffusion. This leads to a semiconductor device with a reduced size.

The method for production of a semiconductor memory device according to the present invention is characterized in that the memory node contact plug is connected to the semiconductor layer through a metallized region. This method eliminates heat treatment for impurity diffusion from the memory node contact plug, and hence no distance is necessary for alignment of lithography to make the contact hole with lithography to form the gate electrode. This leads to a cell array with a reduced area.

The method for production of a semiconductor device according to the present invention is characterized in that the contact plug and the semiconductor layer are connected to each other through a metallized region. This method eliminates heat treatment for impurity diffusion from the contact plug, and hence no distance is necessary for alignment for impurity diffusion. This leads to a semiconductor device with a reduced size.

BRIEF DESCRIPTION OF THE DRAWINGS

FIG. 13 is a sectional view showing important parts of the memory cell of the DRAM pertaining to a fourth embodiment of the present invention;

FIG. 15A is a sectional view of a memory cell of a DRAM according to the first conventional embodiment; FIG. 15B is a plan view of the memory cell; the sectional view in FIG. 15A is taken along the line X-X' in FIG. 15B.

DESCRIPTION OF THE PREFERRED EMBODIMENTS

A description is made below with reference to the accompanying drawings of the DRAM (as a semiconductor memory device pertaining to the present invention) and the method for production thereof.

First Embodiment

Figure 1:
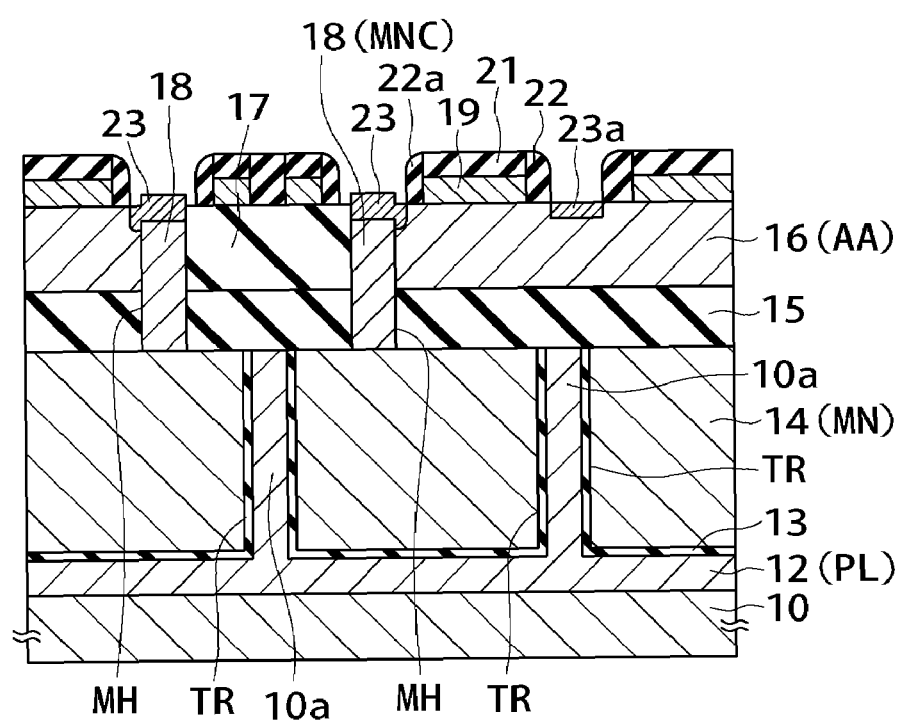
FIG. 1 is a sectional view showing the memory cell of the DRAM pertaining to a first embodiment of the present invention.

FIG. 1 is a sectional view of the memory cell of the DRAM pertaining to the present invention.

There is shown a semiconductor substrate 10, in which is a trench TR separated by a trench wall 10a. There is shown a first n-type semiconductor layer 12 with a prescribed depth from the surface of the inner wall of the trench TR. It functions as a plate electrode PL of the memory capacitor.

There is shown a capacitor insulating film 13 which covers the surface of the inner wall of the trench TR. There is shown a second n-type semiconductor layer 14 of polysilicon which fills the inside of the capacitor insulating film 13. It functions as the memory node electrode MN of the memory capacitor.

As mentioned above, the memory capacitor is composed of the first n-type semiconductor layer 12 (plate electrode PL), the capacitor insulating film 13, and the second n-type semiconductor layer 14 (memory node electrode MN).

There is shown an interlayer insulating film 15 of silicon oxide which covers the memory capacitor mentioned above. It is covered with a third n-type semiconductor layer 16 of crystalline silicon which functions as the active region AA.

The third n-type semiconductor layer 16 (active region AA) is separated by an STI-type element isolation insulating film 17 of silicon oxide. There is shown a fourth semiconductor layer 18 of polysilicon (memory node contact plug MNC), which is buried in the memory node contact hole MH reaching the second n-type semiconductor layer 14 (memory node electrode MN) and which is at the boundary between the element isolation insulating film 17 and the third n-type semiconductor 16 (active region AA).

The third n-type semiconductor layer 16 (active region AA) includes a channel forming region and a source-drain region (not shown) holding it. On that part of the third n-type semiconductor layer 16 (active region AA) corresponding to the channel forming region is a gate electrode 19, with a gate insulating film (not shown) interposed thereunder. The above-mentioned constituents constitute a MOSFET.

On the gate electrode 19 is an offset insulating film 21 of silicon nitride (for example). On both sides of the gate electrode 19 are side wall insulating film (22, 22a) of silicon nitride (for example). The side wall insulating film 22a close to the memory contact plug MNC of the gate electrode is narrower than the other side wall insulating film 22.

The side wall insulating film 22a is narrower than the side wall insulating film 22, so that the surface of the third n-type semiconductor layer 16 is partly exposed without being completely covered by the side wall insulating film 22a. This partly exposed surface and the surface of the fourth semiconductor layer 18 (memory node contact plug MNC) are covered all together with a metal silicide layer 23 as a metallized region of cobalt or nickel. This metallized region electrically connects the source-drain (close to the memory node contact plug MNC) of the MOSFET formed in the third n-type semiconductor layer 16 to the fourth semiconductor layer 18 (memory node contact plug MNC). It is only necessary that the metal silicide layer 23 should be integrally formed on at least part of the surface of the third n-type semiconductor layer 16 and at least part of the surface of the fourth semiconductor layer 18 (memory node contact plug MNC).

There is also formed a metal silicide layer 23a connected to the other source-drain of the MOSFET. This layer is connected to a bit line through a bit contact (not shown). The gate electrode 19 is connected to a word line.

A large number of memory cells each constructed as mentioned above are put together into a matrix pattern to form a DRAM.

The DRAM composed of memory cells as mentioned above offers the following advantage. The MOSFET and the memory capacitor are vertically placed on top of the other, with an interlayer insulating film 15 interposed between them. This structure eases restrictions imposed by the active region AA and permits the area of the memory capacitor to be maximized. There is no need for making an unnecessarily deep trench, and the trench may have a large opening. This facilitates the photolithography process and greatly reduces the length of etching time.

The fact that the source-drain (close to the memory node contact plug MNC) of the MOSFET formed in the third n-type semiconductor layer 16 is connected to the memory node contact plug MNC by the metal silicide layer 23 in place of an impurity diffused from the memory node contact plug MNC obviates the necessity for heat treatment for impurity diffusion from the memory node contact plug MNC. Thus no distance is necessary for alignment of lithography to make the contact hole and lithography to form the electrode. This permits the cell array area to be reduced.

The method for producing the above-mentioned DRAM pertaining to this embodiment will be described below with reference to the accompanying drawings.

Figure 2A:
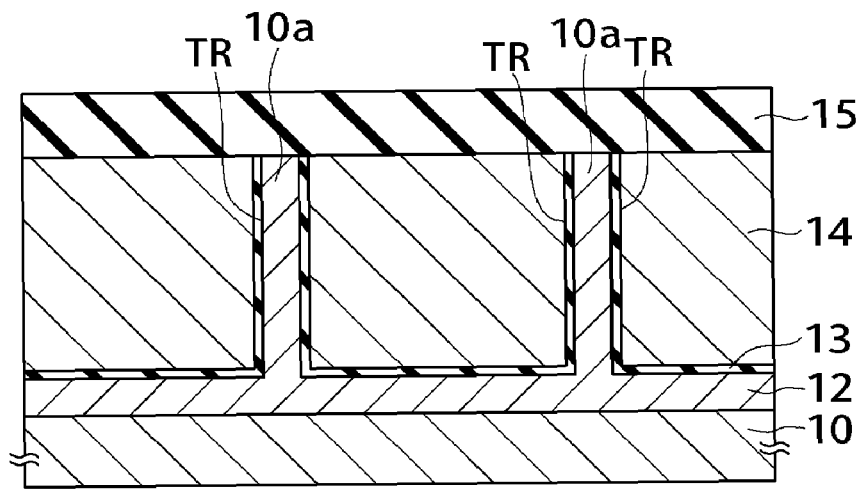
FIGS. 2A and 2B are sectional views showing the method for production of the DRAM pertaining to a first embodiment of the present invention.

The steps up to the stage of process shown in FIG. 2A are described first.

A mask layer is formed on the semiconductor substrate 10. This mask layer has an opening conforming to the trench pattern. Etching is performed through this mask so as to form the trench TR in the semiconductor substrate 10.

The first n-type semiconductor layer 12 (which becomes the plate electrode PL of the memory capacitor) is formed to a prescribed depth from the surface of the inner wall of the trench TR. The mask layer 11 is removed. The capacitor insulating film 13 is formed on the surface of the inner wall of the trench TR by CVD (Chemical Vapor Deposition) or the like.

The trench TR is filled to form the second n-type semiconductor layer 14 (memory node electrode MN). The interlayer insulting film 15 of silicon oxide is formed which entirely covers the semiconductor substrate 10 and the second n-type semiconductor layer 14. This step may also be accomplished in the following manner. The trench TR is filled such that the second n-type semiconductor layer 14 is thicker than the top end of the trench TR. The region from the top end to the trench wall 10a is made into the interlayer insulating film 15, and the second n-type semiconductor layer 14 is divided into individual trenches TR.

Figure 2B:
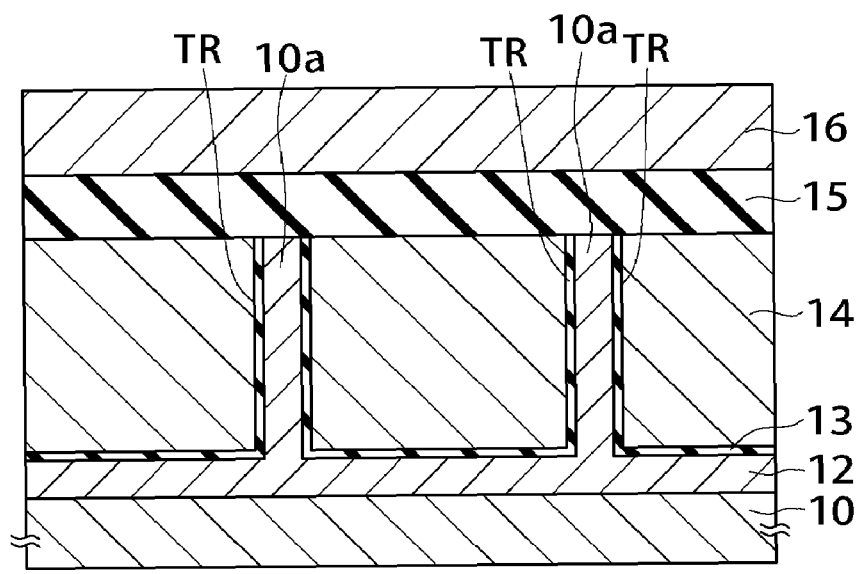

The subsequent steps up to the stage shown in FIG. 2B are described next. The third n-type semiconductor layer 16 of crystalline silicon (50 to 150 nm thick) is formed on the interlayer insulating film 15 by the same way as used to form an SOI substrate.

This step is accomplished as follows. A second silicon semiconductor substrate is bonded to the interlayer insulting film 15. The surface of the second semiconductor substrate is ground and polished so that a crystalline silicon layer of desired thickness remains. Alternatively, the second silicon semiconductor substrate previously undergoes hydrogen diffusion to a prescribed depth, and then it is bonded to the interlayer insulating film 15. The region into which hydrogen has diffused is removed by heat treatment, so that the crystalline silicon layer remains.

Figure 3A:
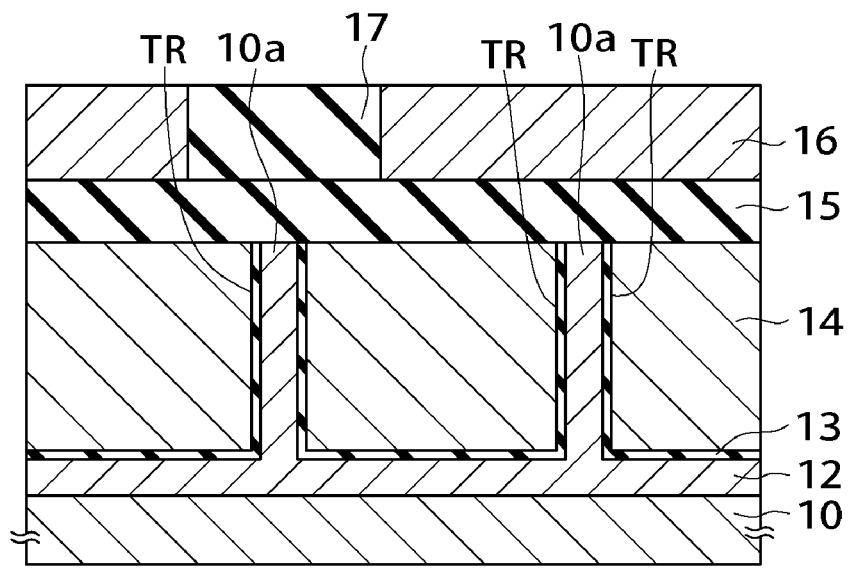
FIGS. 3A and 3B are sectional views showing the method for production of the DRAM pertaining to a first embodiment of the present invention.

As shown in FIG. 3A, the element isolation insulating film 17 is formed by the STI process as follows. That part of the third n-type semiconductor layer 16 in which the element isolation region is to be formed undergoes etching for its removal with an etching gas which selectively removes silicon and stops at silicon oxide. The opening formed by etching is filled with an insulator (such as silicon oxide). The insulator projecting from the opening is removed by grinding.

The active region AA separated by the element isolation insulating film 17 is arranged above the trench TR.

Figure 3B:
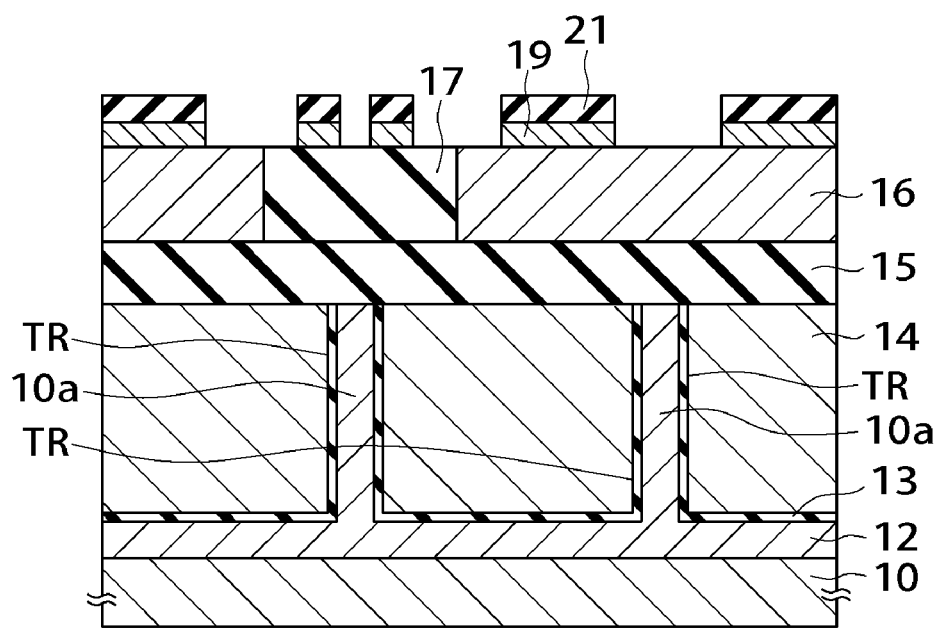

As shown in FIG. 3B, ion implantation to form the well, ion implantation to adjust the threshold value, and heat treatment are performed, and then a gate insulating film (not shown) is formed on the third n-type semiconductor layer 16. The gate electrode 19 of polysilicon is patterned through the offset insulating film 21 of silicon nitride formed thereon.

Figure 4A:
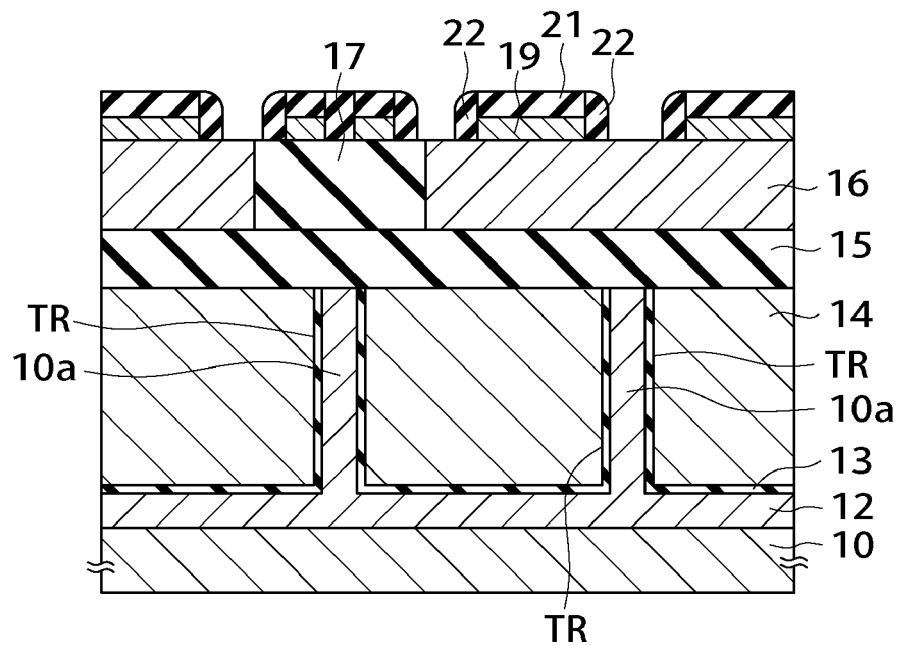
FIGS. 4A and 4B are sectional views showing the method for production of the DRAM pertaining to a first embodiment of the present invention.

As shown in FIG. 4A, a silicon nitride film (about 150 nm thick) is deposited by CVD over the entire surface. Etch-back is performed to form the side wall insulating film 22 on both sides of the gate electrode 19 and the offset insulating film 21.

It is also possible to form the source-drain region of LDD structure by ion implantation with conductive impurities before and after the side wall insulating film 22 is formed. In this case, the side wall insulating film 22 functions as the offset spacer to form the LDD structure. It is also possible to form the source-drain region either before or after the side wall insulating film 22 is formed.

Figure 4B:
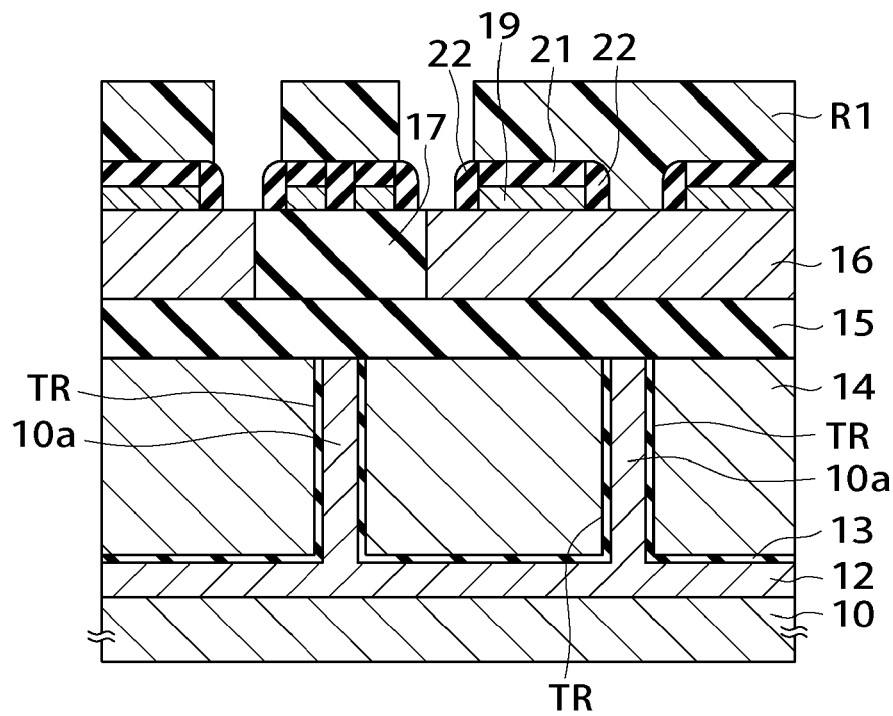

As shown in FIG. 4B, the resist film R1 is patterned by photolithography process. This pattern is used later to open the region in which the memory node contact plug is formed.

The opening of the pattern in the resist film R1 may be formed with a certain amount of margin for the opening of the memory node contact hole, because the opening of the memory node contact hole is made by using the side wall insulating film 22 as a self-aligning mask.

Figure 5A:
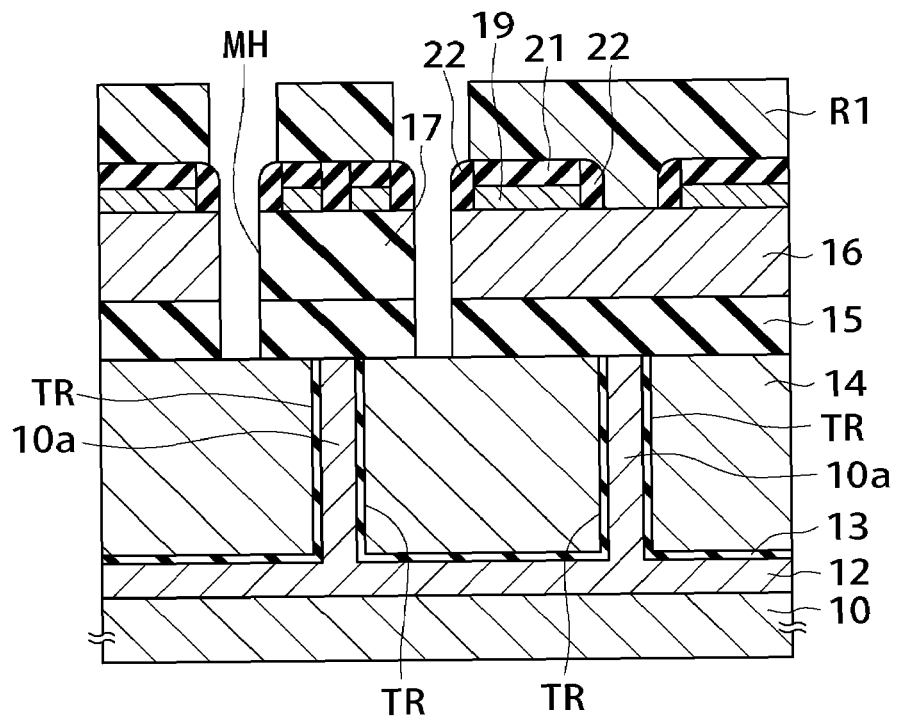
FIGS. 5A and 5B are sectional views showing the method for production of the DRAM pertaining to a first embodiment of the present invention.

As shown in FIG. 5A, anisotropic etching, such as reactive ion etching (RIE), is performed in the opening region of the resist film R1 through the side wall insulating film 22 as a self-aligning mask. This step forms the memory node contact hole reaching the second n-type semiconductor region 14 (memory node electrode MN).

The memory node contact hole MH opens in the region ranging from the third n-type semiconductor layer 16 to the element isolation insulating film 17; therefore, the side wall insulating film 22 is formed from silicon nitride having a different selective ratio than silicon oxide constituting the element isolation insulating film 17.

After that, the resist film R1 is removed by ashing or the like.

Figure 5B:
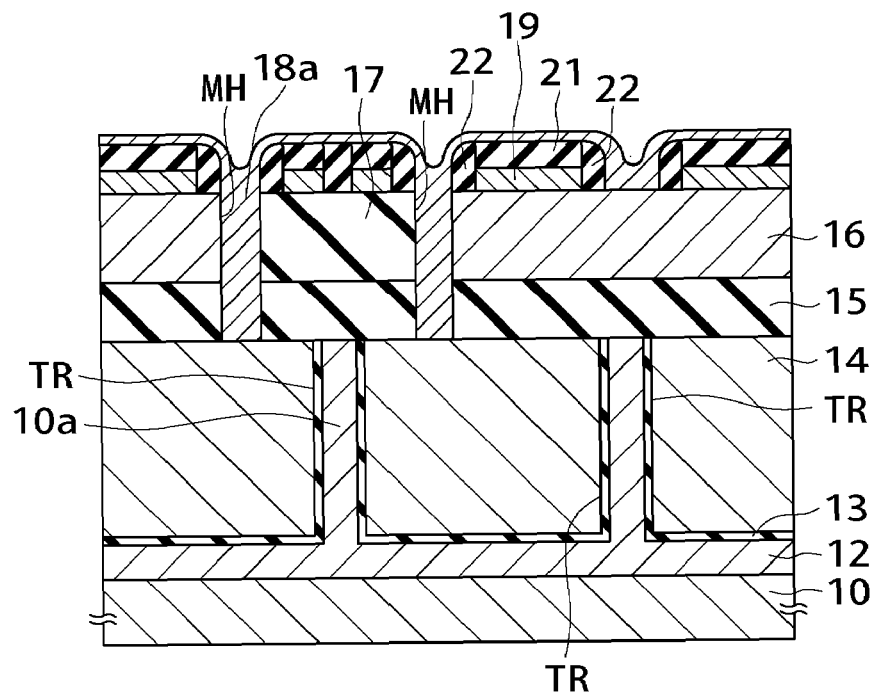

As shown in FIG. 5B, polysilicon is deposited by CVD to fill the memory node contact hole MH and to cover the entire surface. In this way, the fourth semiconductor layer 18a is formed.

Figure 6A:
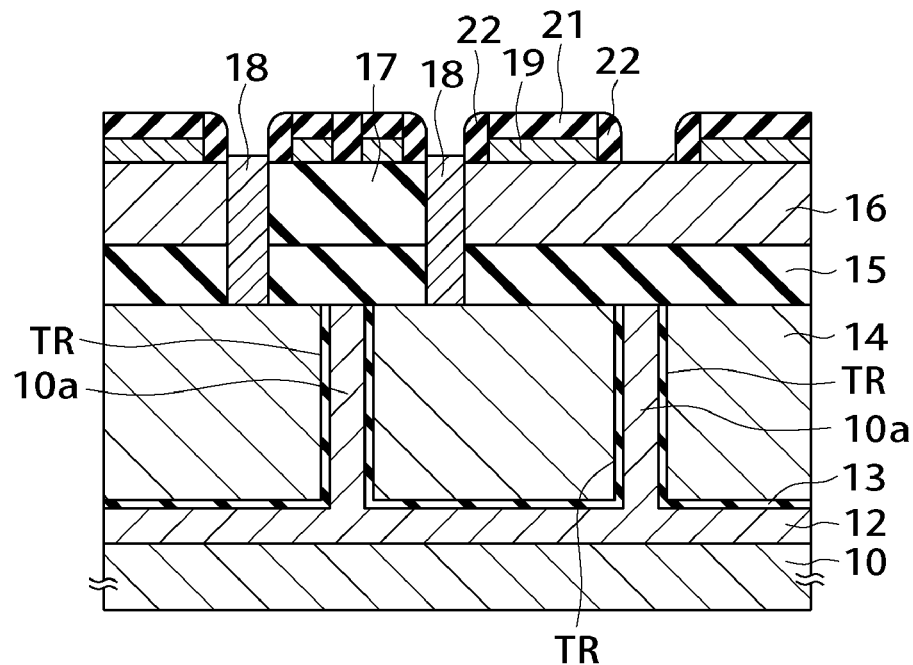
FIGS. 6A and 6B are sectional views showing the method for production of the DRAM pertaining to a first embodiment of the present invention.

As shown in FIG. 6A, etch-back is performed in such a way as to leave the fourth semiconductor layer 18a which has been deposited in the memory node contact hole MH. In this way there is obtained the fourth semiconductor layer 18 (memory node contact plug MNC) connecting to the second n-type semiconductor layer 14 (memory node electrode MN).

In the above-mentioned process, the bit contact region is also filled with polysilicon and consequently it is possible to prevent polysilicon from remaining in the bit contact region if a masking agent is previously buried and subsequently removed. In addition, the bit contact region is usually larger than the memory node contact hole and consequently it is possible to prevent polysilicon from remaining in the bit contact region if an adequate adjustment is made to the film thickness of polysilicon to be deposited for the memory node contact plug.

Figure 6B:
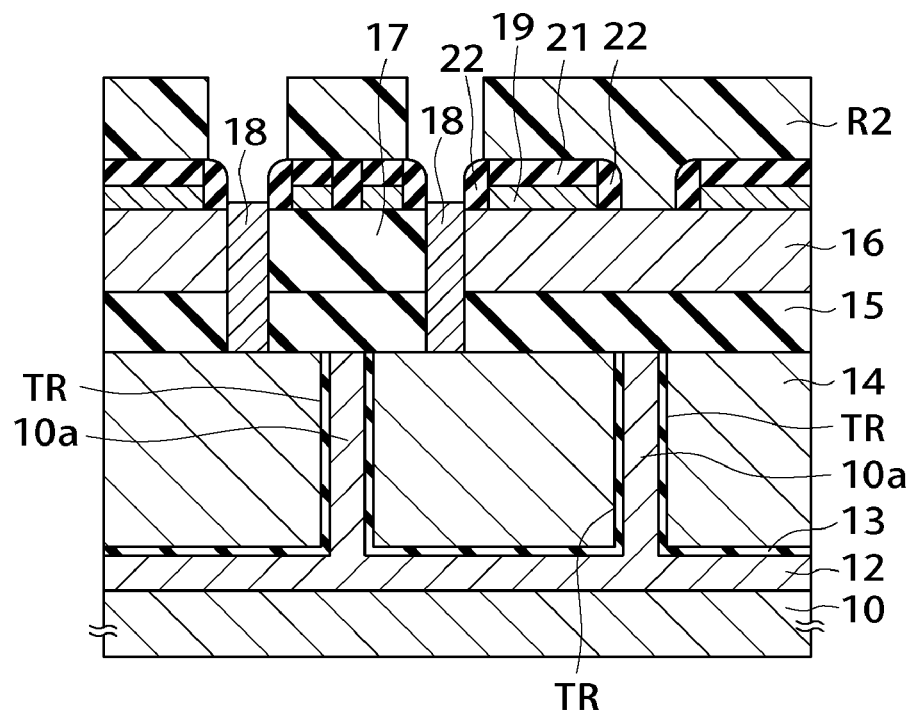

As shown in FIG. 6B, a resist film R2 is formed and then patterned by photolithography. The pattern corresponds to the opening of the side wall insulating film 22 adjacent to the memory node contact plug MNC. This pattern may be identical with that in the above-mentioned resist film R1.

Figure 7A:
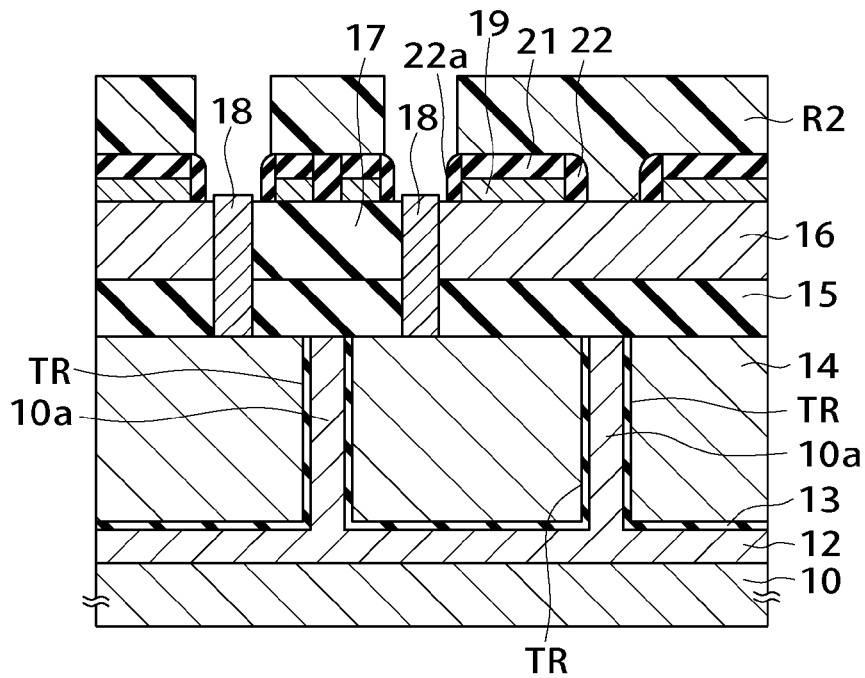
FIGS. 7A and 7B are sectional views showing the method for production of the DRAM pertaining to a first embodiment of the present invention.

As shown in FIG. 7A, etching (such as wet etching) is performed in the region of the opening of the resist film R2, so that the surface of the side wall insulating film 22 retreats.

As the result of etching, the side wall insulating film 22a becomes narrower than before retreat, so that the surface of the third n-type semiconductor layer 16 is partly exposed.

The resist film R2 is removed by ashing or the like.

Figure 7B:
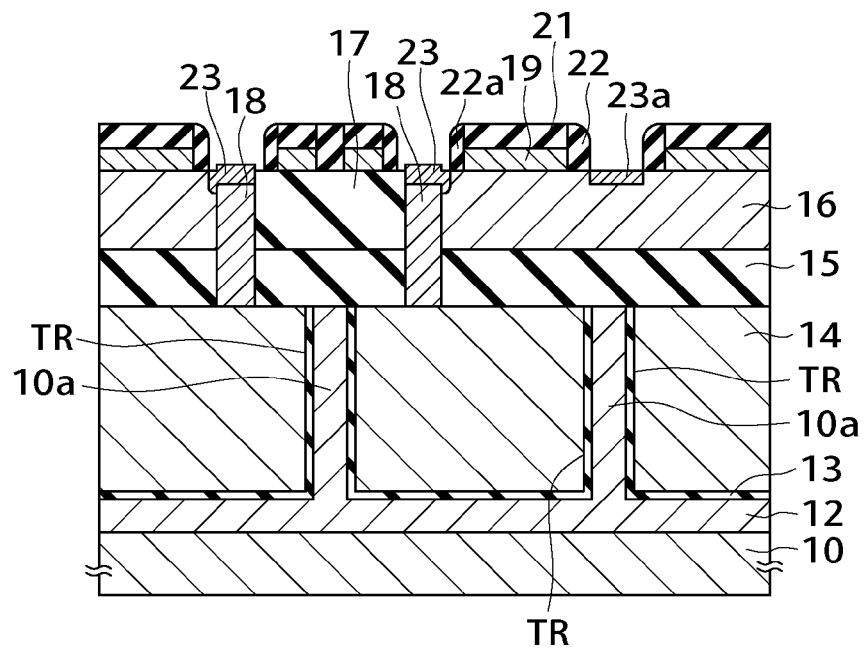

As shown in FIG. 7B, the metal silicide layer 23 (as the metallized region of cobalt or nickel) is integrally formed on the surface of the third n-type semiconductor layer 16 (which has been exposed in the preceding step) and on the surface of the fourth semiconductor layer 18 (memory node contact plug MNC). In this way it is possible to obviate the necessity of conventional heat treatment for impurity diffusion from the fourth semiconductor layer 18 (memory node contact plug MNC) to the third n-type semiconductor layer 16.

The metal silicide layer 23a is also formed on that part of the third n-type semiconductor layer 16 which corresponds to the bit contact region adjacent to the side wall insulating film 22 whose surface does not retreat.

The metal silicide layers (23, 23a) are formed by self-alignment on the region where silicon is exposed.

After that, the bit line is connected through the bit contact and the word line is connected to the gate electrode 19. In this way there is obtained the DRAM constructed as shown in FIG. 1.

The method used in this embodiment for production of DRAM offers the following advantage. The source-drain (close to the memory node contact plug MNC) of the MOSFET formed in the third n-type semiconductor layer 16 is connected to the memory node contact plug MNC by the metallized region (or the metal silicide layer 12) in place of an impurity diffused from the memory node contact plug MNC. This structure obviates the necessity for heat treatment for impurity diffusion from the memory node contact plug MNC. Thus no distance is necessary for alignment of lithography to make the contact hole and lithography to form the gate electrode. The result is a cell array with a reduced area.

In this embodiment, the resist mask used to open the memory node contact hole may be replaced by a hard mask of silicon oxide or silicon nitride. The hard mask may be retained when the memory node contact plug is filled with polysilicon. In this way it is possible to use the hard mask as the mask for etching to retreat the surface of the embedded side wall insulating film.

In this case the aspect ratio may be large when the memory node contact plug is embedded. There may be an instance in which polysilicon is not etched off satisfactorily when overall etch back is performed on the bit contact region. Even in such a case, the hard mask mentioned above covers the bit contact region, so that there is no possibility of polysilicon being embedded. And the hard mask may be removed after height adjustment, so that polysilicon is accurately embedded in the memory node contact hole.

Second Embodiment

Figure 8:
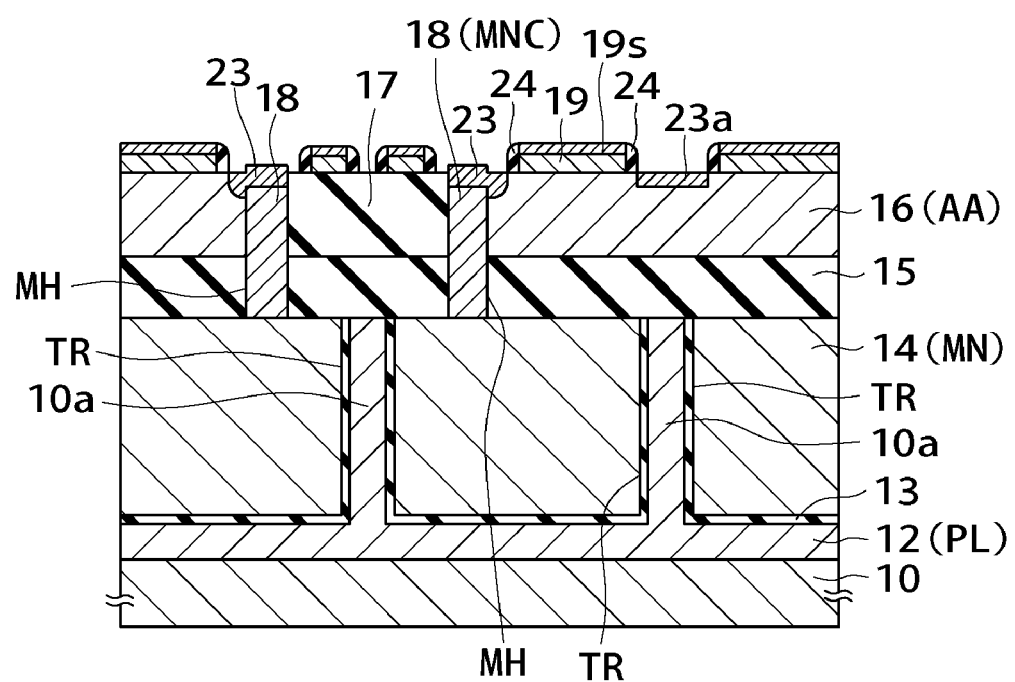
FIG. 8 is a sectional view showing the memory cell of the DRAM pertaining to a second embodiment of the present invention.

FIG. 8 is a sectional view of the memory cell of the DRAM pertaining to the present invention.

This DRAM is substantially identical with that in the first embodiment, except that the offset insulating film on the gate electrode 19 does not exist, the side wall insulating film 24 (with its surface retreated) exists on both sides of the gate electrode 19 which are close to the memory node contact and the bit contact, and the metal silicide layer 19a exists also on the surface of the gate electrode 19.

The DRAM according to this embodiment is characterized in that the source-drain (close to the memory node contact plug MNC) of the MOSFET formed in the third n-type semiconductor layer 16 is connected to the memory node contact plug MNC by the metallized region (or the metal silicide layer 23) in place of an impurity diffused from the memory node contact plug MNC. This structure obviates the necessity for heat treatment for impurity diffusion from the memory node contact plug MNC. Thus no distance is necessary for alignment of lithography to make the contact hole and lithography to form the gate electrode. The result is a cell array with a reduced area.

The method for producing the above-mentioned DRAM pertaining to this embodiment will be described below with reference to the accompanying drawings.

Figure 9A:
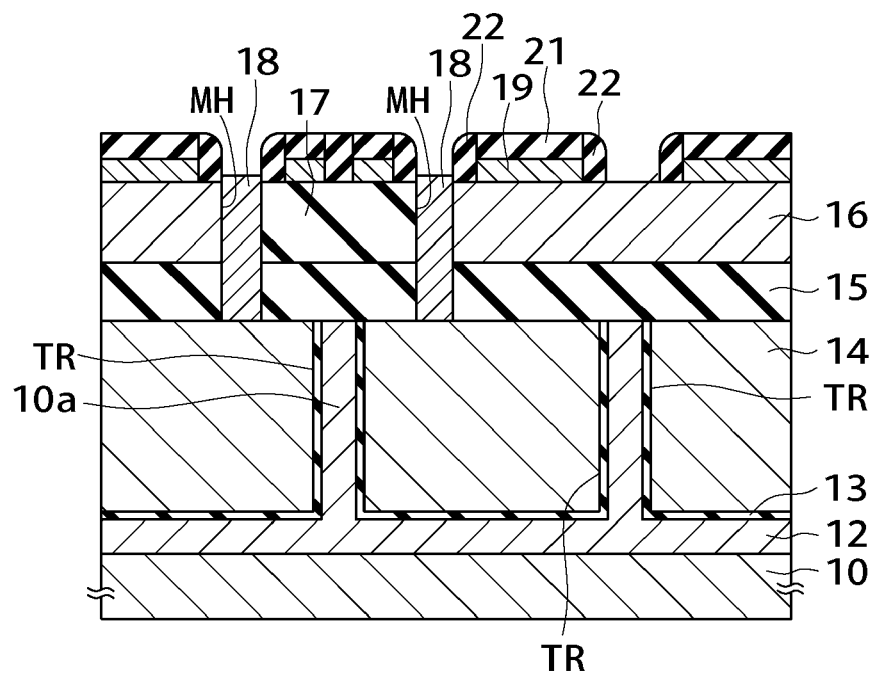
FIGS. 9A and 9B are sectional views showing the steps of production of the DRAM pertaining to the second embodiment of the present invention.

The steps up to the stage shown in FIG. 9A are the same as those shown in FIG. 6A in the first embodiment.

Figure 9B:
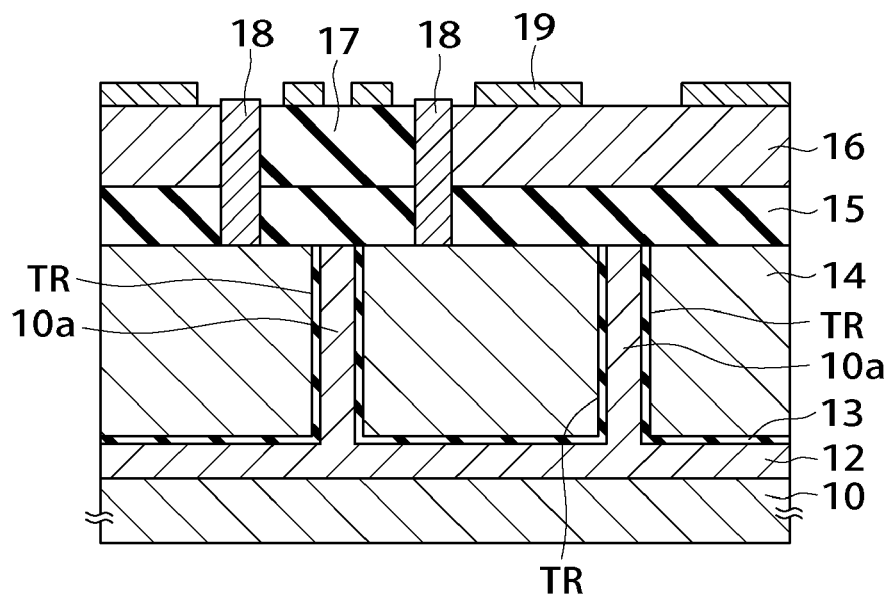

As shown in FIG. 9B, selective etching to remove silicon nitride in preference to silicon or silicon oxide is performed to remove the offset insulating film 21 and the side wall insulating film 22.

Figure 10A:
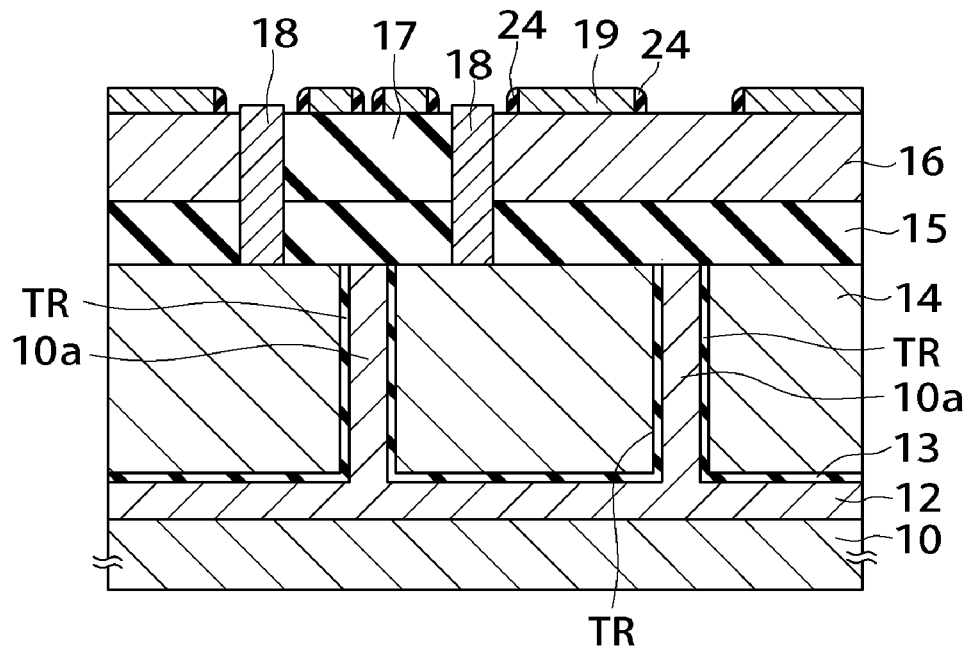
FIGS. 10A and 10B are sectional views showing the steps of production of the DRAM pertaining to the second embodiment of the present invention.

As shown in FIG. 10A, silicon nitride is deposited by CVD over the entire surface. Then, etch-back is performed to form new side wall insulating films 24 on both sides of the gate electrode 19.

Here, the new side wall insulating film 24 should be narrower than the above-mentioned side wall insulating film 22. This object is achieved by controlling the thickness of the silicon nitride film to be deposited.

This produces the same effect as retreating the surface of the side wall insulating film. As the result, the third n-type semiconductor layer 16 is partly exposed.

In this embodiment, the offset insulating film 21 on the gate electrode 19 is absent as mentioned above, and the gate is low as much as the offset insulating film 21 when the new side wall insulating films 24 are formed. Therefore, the ordinary process for forming the side wall naturally forms the side wall insulating film 24 narrower than the side wall insulating film 22 which has been formed in the preceding step.

Figure 10B:
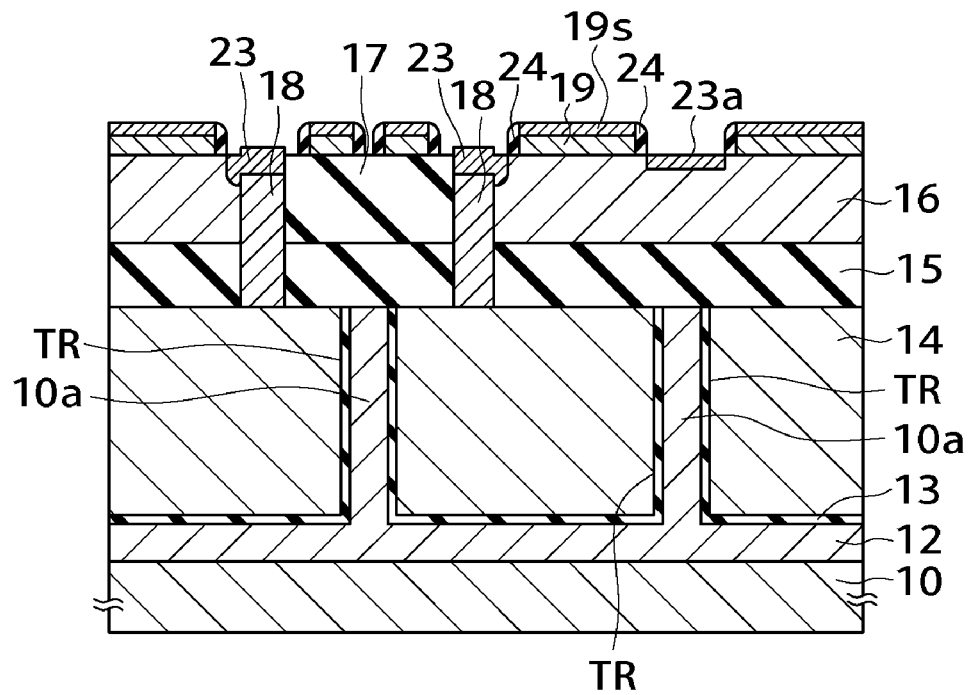

As shown in FIG. 10B, the metal silicide layer 23 (as the metallized region of cobalt or nickel) is integrally formed on the surface of the third n-type semiconductor layer 16 (which has been exposed in the preceding step) and on the surface of the fourth semiconductor layer 18 (memory node contact plug MNC). In this way it is possible to obviate the necessity of conventional heat treatment for impurity diffusion from the fourth semiconductor layer 18 (memory node contact plug MNC) to the third n-type semiconductor layer 16.

The metal silicide layer 23a is also formed on that part of the third n-type semiconductor layer 16 which corresponds to the bit contact region adjacent to the side wall insulating film 22 whose surface does not retreat.

The side wall insulating film 22 formed in the preceding step is removed in the bit contact region. The new side wall insulating film 24 which is as narrow as the side of the memory node contact is formed. The metal silicide layer 23a is formed in the third n-type semiconductor layer 16. As mentioned above, this embodiment is effective in the case where the source-drain profile is required to be equal at the side of the bit contact and the side of the memory node contact, because the width of the side wall can be made equal to that at the side of the memory node.

The metal silicide layer 19a is formed also on the surface of the gate electrode 19. In this case, the metal silicide layers (23, 23a, 19a) are formed by self-alignment in the region where silicon is exposed on the surface.

After that, the bit line is connected through the bit contact and the word line is connected to the gate electrode 19. In this way there is obtained the DRAM constructed as shown in FIG. 1.

The method used in this embodiment for production of DRAM offers the following advantage. The source-drain (close to the memory node contact plug MNC) of the MOSFET formed in the third n-type semiconductor layer 16 is connected to the memory node contact plug MNC by the metallized region (or the metal silicide layer 12) in place of an impurity diffused from the memory node contact plug MNC. This structure obviates the necessity for heat treatment for impurity diffusion from the memory node contact plug MNC. Thus no distance is necessary for alignment of lithography to make the contact hole and lithography to form the gate electrode. The result is a cell array with a reduced area.

Third Embodiment

Figure 11:
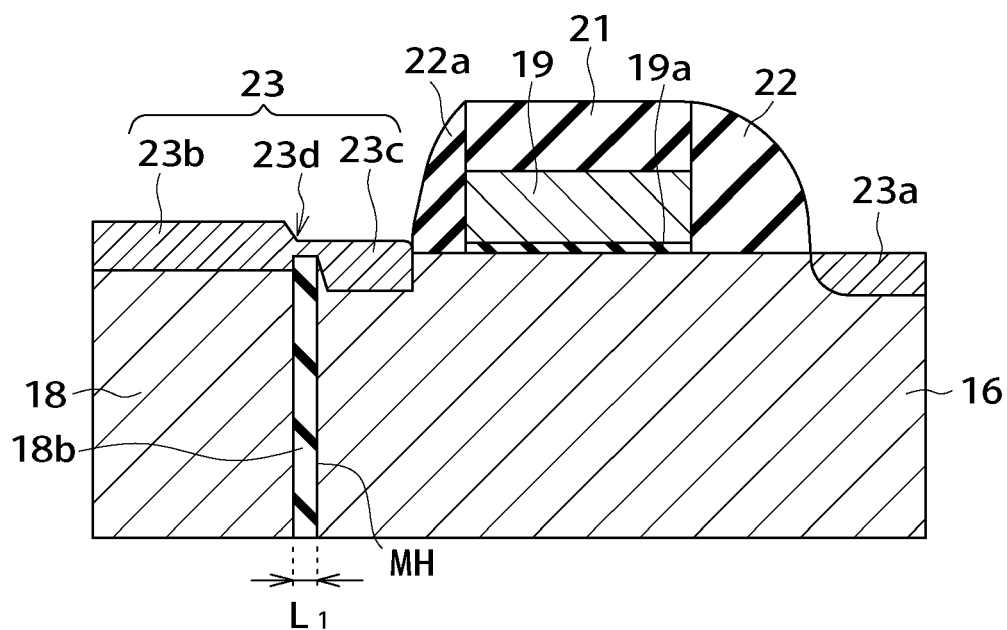
FIG. 11 is a sectional view showing important parts of the memory cell of the DRAM pertaining to a third embodiment of the present invention.

FIG. 11 is a sectional view showing the important parts of the memory cell of the DRAM pertaining to this embodiment.

This DRAM is substantially identical with that in the first embodiment, except that the cylindrical insulating film 18b is formed on the surface of the side wall of the memory node contact hole MH and the memory node contact plug 18 is formed inside the cylindrical insulating film 18b.

The cylindrical insulating film 18b has a thickness $L_1$ which is about 1 nm. The cylindrical insulating film 18b completely prevents impurities from diffusing from the fourth semiconductor layer 18 (memory node contact plug MNC) to the third n-type semiconductor layer 16. Thus no distance is necessary for alignment of lithography to make the contact hole and lithography to form the gate electrode. The result is a cell array with a reduced area.

On the channel forming region of the third n-type semiconductor region 16 are the gate electrode 19 and the offset insulating film 21, with the gate insulating film 19a interposed thereunder. There is the side wall insulating film 22a which is narrower at the side of the memory node contact plug. There is the metal silicide layer 23a which is formed on the exposed surface extending from the side wall insulating film 22a. The metal silicide film 23a is formed also on the surface at the side of the bit contact.

In addition, there is the metal silicide layer 23b which is formed on the surface of the fourth semiconductor layer 18 (memory node contact plug MNC). The metal silicide layer 23b is connected to the metal silicide layer 23c through the metal silicide layer 23d which gets over the upper part of the cylindrical insulating film 18b.

Figure 12:
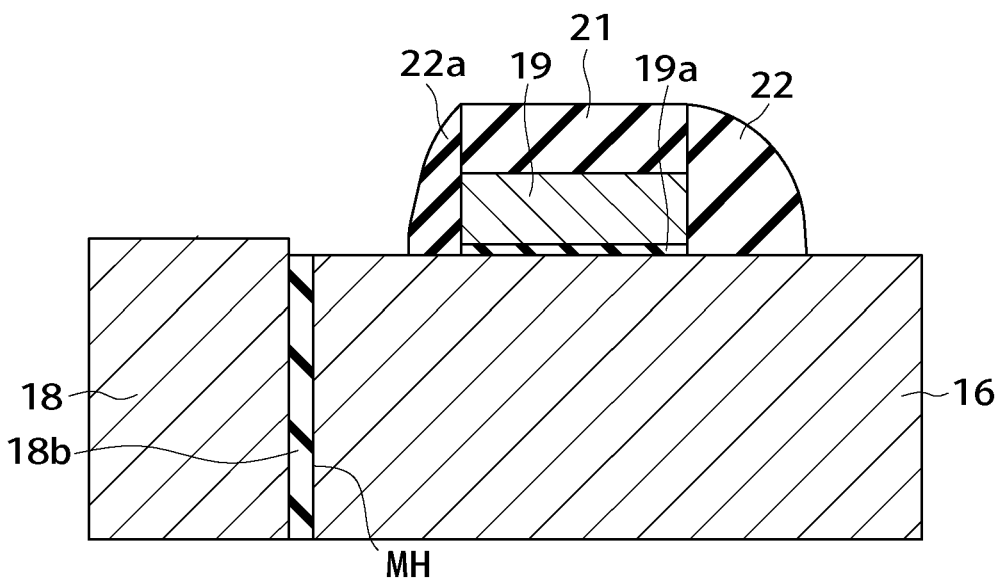
FIG. 12 is a sectional view showing the steps of production of the DRAM pertaining to a third embodiment of the present invention.

FIG. 12 is a sectional view showing the important parts of the memory cell of the DRAM produced by the method pertaining to this embodiment.

As in the first embodiment, the production method includes the steps of making the memory node contact hole MH, forming the cylindrical insulating film 18b on the surface of the side wall of the memory node contact hole MH, and forming the fourth semiconductor layer 18 (memory node contact plug MNC) inside the cylindrical insulating film 18b.

In this state the metal silicide layer is formed on the surface of the third n-type semiconductor layer 16 and the surface of the fourth semiconductor layer 18 (memory node contact plug MNC). If the cylindrical insulating film 18b is as thin as about 1 nm, the metal silicide layer 23d gets over the upper part of the cylindrical insulating film, so that it is possible to integrally form the metal silicide layer 23 on both the surface of the third n-type semiconductor layer 16 and the surface of the fourth semiconductor layer 18 (memory node contact plug MNC).

Fourth Embodiment

FIG. 13 is a sectional view showing the important parts of the memory cell of the DRAM pertaining to this embodiment.

As in the third embodiment, the DRAM pertaining to this embodiment has the cylindrical insulating film 18b formed on the surface of the side wall of the memory node contact hole MH. It also has the memory node contact plug 18 formed inside the cylindrical insulating film 18b.

The cylindrical insulating film 18b has a thickness $L_2$ which is about 10 nm. The cylindrical insulating film 18b completely prevents impurities from diffusing from the fourth semiconductor layer 18 (memory node contact plug MNC) to the third n-type semiconductor layer 16. Thus no distance is necessary for alignment of lithography to make the contact hole and lithography to form the gate electrode. The result is a cell array with a reduced area.

As in the third embodiment, the DRAM pertaining to this embodiment has the gate electrode 19 and the offset insulating film 21 on the channel forming region of the third n-type semiconductor region 16, with the gate insulating film 19a interposed thereunder. It also has the metal silicide layer 23c which is formed on the exposed surface extending from the side wall insulating film 22a. The metal silicide film 23a is formed also on the surface at the side of the bit contact.

In addition, there is the metal silicide layer 23b which is formed on the surface of the fourth semiconductor layer 18 (memory node contact plug MNC). The metal silicide layer 23b is connected to the metal silicide layer 23c through the metal silicide layer 23d which gets over the upper part of the cylindrical insulating film 18b.

Figure 14A:
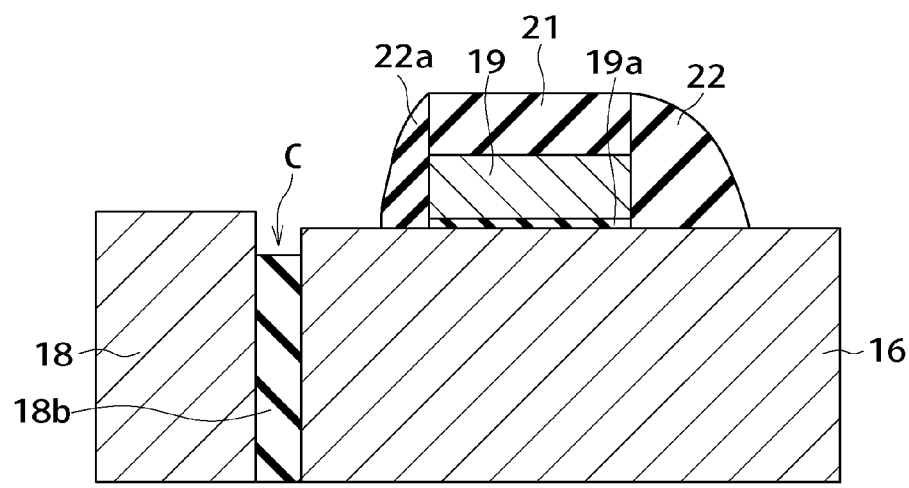
FIGS. 14A and 14B are sectional views showing the steps of production of the DRAM pertaining to a fourth embodiment of the present invention.
Figure 14B:
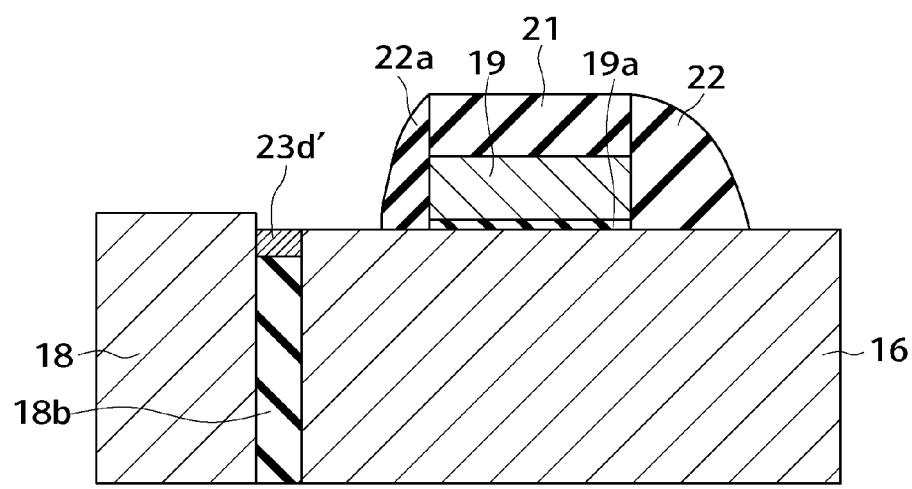
Figure 16A:
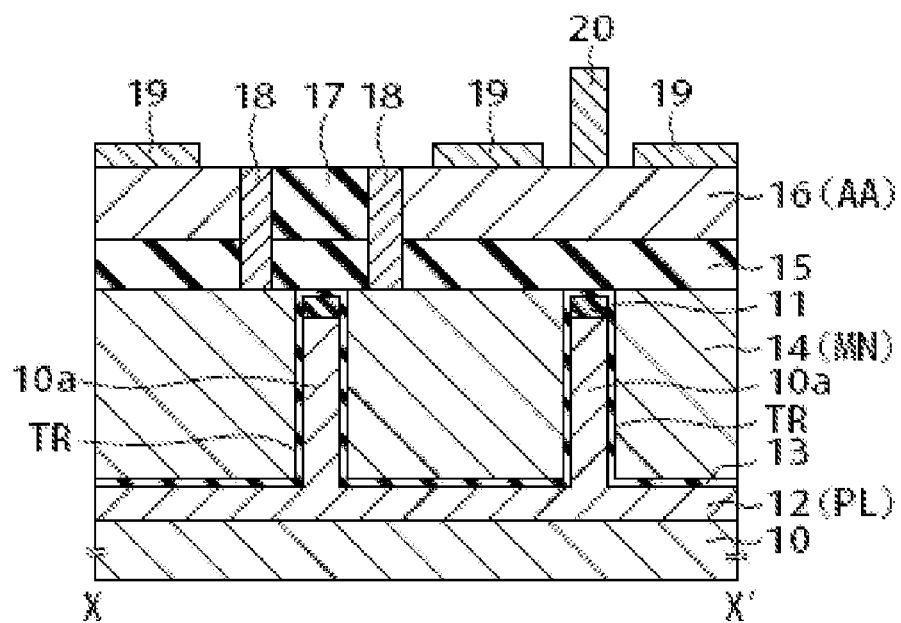
FIG. 16A is a sectional view of a memory cell of a DRAM according to the second conventional embodiment.
Figure 16B:
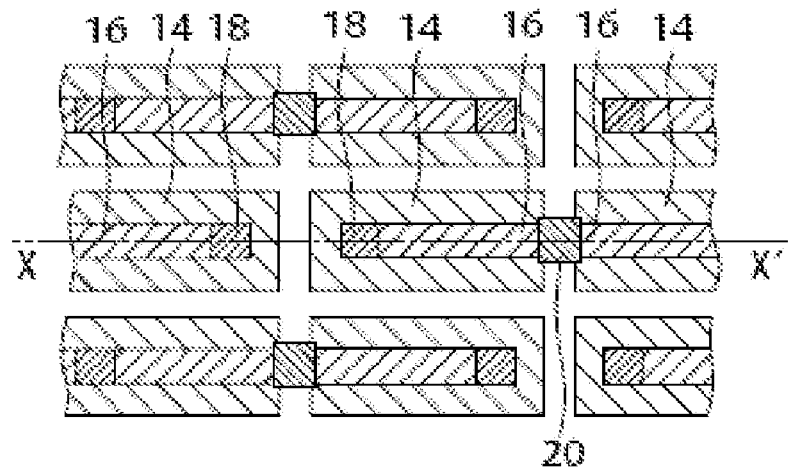
FIG. 16B is a plan view of the memory cell. The sectional view in FIG. 16A is taken along the line X-X' in FIG. 16B.

FIGS. 14A and 14B are sectional views showing the important parts of the memory cell of the DRAM produced by the method pertaining to this embodiment.

In this embodiment, the thickness $L_2$ of the cylindrical insulating film 18b is larger than that in the third embodiment, as shown in FIG. 14A. As etching is repeated in the fabrication process, the surface of the upper part of the cylindrical insulating film 18b becomes lower than the surface of the third n-type semiconductor layer 16 and the semiconductor layer 18 (memory node contact plug MNC). Eventually the recess C is formed which is surrounded by the third n-type semiconductor layer 16, the side (close to the cylindrical insulating film 18b) of the fourth semiconductor layer 18 (memory node contact plug MNC), and the upper surface of the cylindrical insulating film 18b.

In such a case, it is impossible to form the silicide layer that gets over the recess C on the surface of the third n-type x layer 16 and the surface of the fourth semiconductor layer 18 (memory node contact plug MNC).

This embodiment is designed to tackle this problem in the following manner. As shown in FIG. 14B, the recess C is filled with a conductive film 23d′ by forming a conductive film of polysilicon over the entire surface of the recess C and then performing etch-back. The process of conversion into silicide is performed so that the conductive film 23d' is converted into silicide, as shown in FIG. 13. The resulting metal silicide layer 23d gets over the upper part of the cylindrical insulating film 18b, so that it connects the metal silicide layer 23b and the metal silicide layer 23c to each other.

The foregoing description is not intended to restrict the scope of the present invention.

The embodiments given above illustrate the structure of connection to the semiconductor layer in the memory node contact plug of DRAM. However, the present invention may be applied to other structures of DRAM and semiconductor devices (excluding DRAM) and the method for their production. In such structures, the substructure on the substrate is covered with an insulating film and a semiconductor layer (which are placed on top of the other) and a contact plug is formed which connects the semiconductor layer to the substructure.

The third and fourth embodiments illustrate the DRAM pertaining to the first embodiment which is constructed such that the cylindrical insulating film is formed on the surface of the inner wall of the memory node contact hole. However, the present invention is applicable to the structure of the DRAM pertaining to the second embodiment and the structure of other semiconductor devices than DRAM.

Variations and modifications may be made to the present invention without departing from the scope thereof.

The idea of the semiconductor memory device of the present invention may be applied to the DRAM which has been reduced in size and increased in memory capacity.

The method for producing semiconductor memory device according to the present invention may be applied to production of the DRAM which has been reduced in size and increased in memory capacity.

The idea of the semiconductor device of the present invention may be applied to the semiconductor device which has been reduced in size.

The method for producing semiconductor devices according to the present invention may be applied to production of the semiconductor device which has been reduced in size.

What is claimed is:

1. A method for production of a semiconductor memory device composed of a plurality of memory cells arranged therein, each memory cell consisting of a memory capacitor with a memory node electrode and a transistor, said method comprising the steps of:
    forming a plurality of trenches side by side in a substrate;
    forming a plate electrode which reaches a prescribed depth from the surface of the inner wall of said trench;
    forming a capacitor insulating film which covers the surface of the inner wall of said trench;
    filling said trench to form sad memory node electrode, with said capacitor insulating film interposed;
    forming an interlayer insulating film over the entire surface of said substrate and said memory node electrode;
    forming a semiconductor layer on said interlayer insulating film;
    making a contact hole which reaches said memory node electrode from the surface of said semiconductor layer;
    forming a cylindrical insulating film on the surface of the side wall of said contact hole;
    filling said contact hole with a conductive material to form a memory node contact plug inside said cylindrical insulating film;
    forming the upper surface of said cylindrical insulating film lower than the surface of said semiconductor layer and said memory node contact plug;
    burying a conductive film in the recess surrounded by said semiconductor layer, the side close to said cylindrical insulating film of said memory node contact plug, and the upper surface of said cylindrical insulating film, and
    forming a metallized region integrally with at least part of the surface of said semiconductor layer and at least part of the surface of said memory node contact plug such that the metallized region electrically connects said semiconductor layer to said memory node contact plug and integrally with said conductive film on at least part of the surface of said semiconductor layer and at least part of the surface of said memory node contact plug,
    wherein,
        said metallized region is formed such that the metallized region extends over the upper part of said cylindrical insulating film which is integral with at least part of the surface of said semiconductor layer and at least part of the surface of said memory node contact plug.

2. The method for production of a semiconductor memory device as defined in claim 1, after the step of forming a semiconductor layer on said interlayer insulating film which further, comprising the steps of:
    forming a gate insluting film on the surface of said semiconductor layer;
    forming a gate electrode on said gate insulating film, forming side wall insulating films on both sides of said gate electrode; and
    forming the source-drain region in said semiconductor layer at both sides of said gate electrode, and the step of making said contact hole is accomplished by using said side wall insulating film as a mask for self-alignment.

3. The method for production of a semiconductor memory device as defined in claim 2, after the step of making said contact hole and before the step of forming said metallized region, further comprising the step of:
    retreating the surface of said side wall insulating film, thereby exposing at least part of the surface of said semiconductor layer, and
    said metallized region is formed on the surface of said semiconductor layer which has been exposed.

4. The method for production of a semiconductor memory device as defined in claim 3, wherein the step of retreating the surface of said side wall insulating film is accomplished by etching said side wall insulating film.

5. The method for production of a semiconductor memory device as defined in claim 3, wherein the step of retreating the surface of said side wall insulating film is accomplished such that said side wall insulating film is temporarily removed and a new side wall insulating film is formed which is narrower than said side wall insulating film and which has its surface retreated.

* * * * *